US009818641B1

United States Patent
Bouche et al.

(10) Patent No.: US 9,818,641 B1
(45) Date of Patent: Nov. 14, 2017

(54) APPARATUS AND METHOD OF FORMING SELF-ALIGNED CUTS IN MANDREL AND A NON-MANDREL LINES OF AN ARRAY OF METAL LINES

(71) Applicant: GLOBALFOUNDRIES Inc., Grand Cayman (KY)

(72) Inventors: Guillaume Bouche, Albany, NY (US); Jason Eugene Stephens, Menands, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/271,497

(22) Filed: Sep. 21, 2016

(51) Int. Cl.
| H01L 21/44 | (2006.01) |
| H01L 21/768 | (2006.01) |
| H01L 21/311 | (2006.01) |
| H01L 23/528 | (2006.01) |
| H01L 27/11 | (2006.01) |

(52) U.S. Cl.
CPC .. *H01L 21/76816* (2013.01); *H01L 21/31144* (2013.01); *H01L 21/76897* (2013.01); *H01L 23/528* (2013.01); *H01L 27/11* (2013.01)

(58) Field of Classification Search
None
See application file for complete search history.

(56) References Cited

U.S. PATENT DOCUMENTS

| 6,455,436 B1 | 9/2002 | Ueda et al. |
| 7,183,142 B2 | 2/2007 | Anderson et al. |
| 8,298,943 B1 | 10/2012 | Arnold et al. |
| 8,518,824 B2 * | 8/2013 | Arnold ................ H01L 21/0337 257/E21.002 |
| 8,999,848 B2 | 4/2015 | Lee et al. |
| 9,012,287 B2 | 4/2015 | Liaw |
| 9,123,656 B1 | 9/2015 | Hsieh et al. |
| 9,136,106 B2 | 9/2015 | Wu et al. |
| 9,209,279 B1 | 12/2015 | Zhang et al. |
| 9,406,775 B1 | 8/2016 | Bouche et al. |
| 2005/0215040 A1 | 9/2005 | Doyle |
| 2006/0055045 A1 | 3/2006 | Park et al. |

(Continued)

OTHER PUBLICATIONS

U.S. Appl. No. 15/077,384, filed Mar. 22, 2016.

(Continued)

*Primary Examiner* — Hung Vu
(74) *Attorney, Agent, or Firm* — Heslin Rothenberg Farley & Mesiti P.C.

(57) ABSTRACT

A method includes providing a structure having a first, second and third hardmask layer and a mandrel layer disposed respectively over a dielectric stack. An array of mandrels, a beta trench and a gamma trench are patterned into the structure. First inner spacers are formed on sidewalls of the beta trench and second inner spacers are formed on sidewalls of the gamma trench. The first and second inner spacers form a portion of a pattern. The pattern is etched into the dielectric stack to form an array of mandrel and non-mandrel metal lines extending in a Y direction and being self-aligned in an X direction. The portion of the pattern formed by the first and second inner spacers forms a first pair of cuts in a mandrel line and a second pair of cuts in a non-mandrel line respectively. The cuts are self-aligned in the Y direction.

16 Claims, 17 Drawing Sheets

(56) References Cited

U.S. PATENT DOCUMENTS

| | | |
|---|---|---|
| 2008/0193658 A1 | 8/2008 | Millward |
| 2008/0227298 A1 | 9/2008 | Hirota |
| 2011/0240596 A1 | 10/2011 | Millward |
| 2011/0256723 A1 | 10/2011 | Lee et al. |
| 2011/0316125 A1 | 12/2011 | Thomas |
| 2012/0118854 A1 | 5/2012 | Smayling et al. |
| 2012/0132988 A1 | 5/2012 | Lui et al. |
| 2013/0196517 A1 | 8/2013 | Tsujita et al. |
| 2013/0244344 A1 | 9/2013 | Malmhall et al. |
| 2013/0329486 A1 | 12/2013 | Juengling |
| 2014/0038428 A1 | 2/2014 | Huang et al. |
| 2014/0054534 A1 | 2/2014 | Pellizzer et al. |
| 2014/0170853 A1 | 6/2014 | Shamma et al. |
| 2014/0258961 A1 | 9/2014 | Ke et al. |
| 2014/0273363 A1* | 9/2014 | Chiu ............... H01L 21/3086 438/165 |
| 2014/0273464 A1* | 9/2014 | Shieh ............ H01L 21/82343 438/700 |
| 2015/0056800 A1 | 2/2015 | Mebarki et al. |
| 2015/0072527 A1 | 3/2015 | Ng et al. |
| 2015/0087149 A1 | 3/2015 | He et al. |
| 2015/0108087 A1 | 4/2015 | Somervell et al. |
| 2015/0140811 A1 | 5/2015 | Huang et al. |
| 2015/0147882 A1 | 5/2015 | Yao et al. |
| 2015/0179652 A1* | 6/2015 | Wang .............. H01L 21/0337 257/401 |
| 2015/0243654 A1 | 8/2015 | Zhong et al. |
| 2015/0318173 A1 | 11/2015 | Shih et al. |
| 2015/0339422 A1 | 11/2015 | Greco et al. |
| 2016/0049307 A1 | 2/2016 | Chen |
| 2016/0056075 A1 | 2/2016 | Wei et al. |
| 2016/0056104 A1 | 2/2016 | Bouche et al. |
| 2016/0064248 A1 | 3/2016 | Lee et al. |
| 2016/0086841 A1 | 3/2016 | Song et al. |
| 2016/0099178 A1 | 4/2016 | Zhana et al. |
| 2016/0225634 A1 | 8/2016 | Anderson et al. |
| 2016/0254191 A1 | 9/2016 | Tseng et al. |
| 2017/0221702 A1 | 8/2017 | Lee et al. |

OTHER PUBLICATIONS

U.S. Appl. No. 15/271,475, filed Sep. 21, 2016.
U.S. Appl. No. 15/271,519, filed Sep. 21, 2016.
U.S. Appl. No. 15/141,087, filed Apr. 28, 2016.
U.S. Appl. No. 15/379,605, filed Dec. 15, 2016.
U.S. Appl. No. 15/379,645, filed Dec. 15, 2016.
U.S. Appl. No. 15/379,707, filed Dec. 15, 2016.
U.S. Appl. No. 15/379,740, filed Dec. 15, 2016.
U.S. Appl. No. 15/362,035, filed Nov. 28, 2016.
U.S. Appl. No. 15/053,818, filed Feb. 25, 2016.
U.S. Appl. No. 15/077,480, filed Mar. 22, 2016.
U.S. Appl. No. 15/077,564, filed Mar. 22, 2016.

* cited by examiner

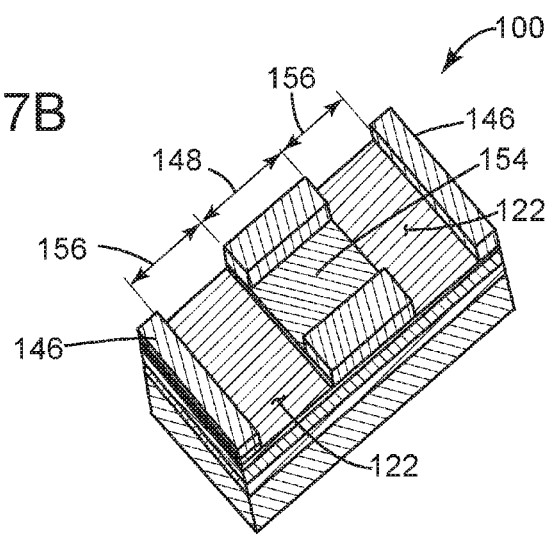
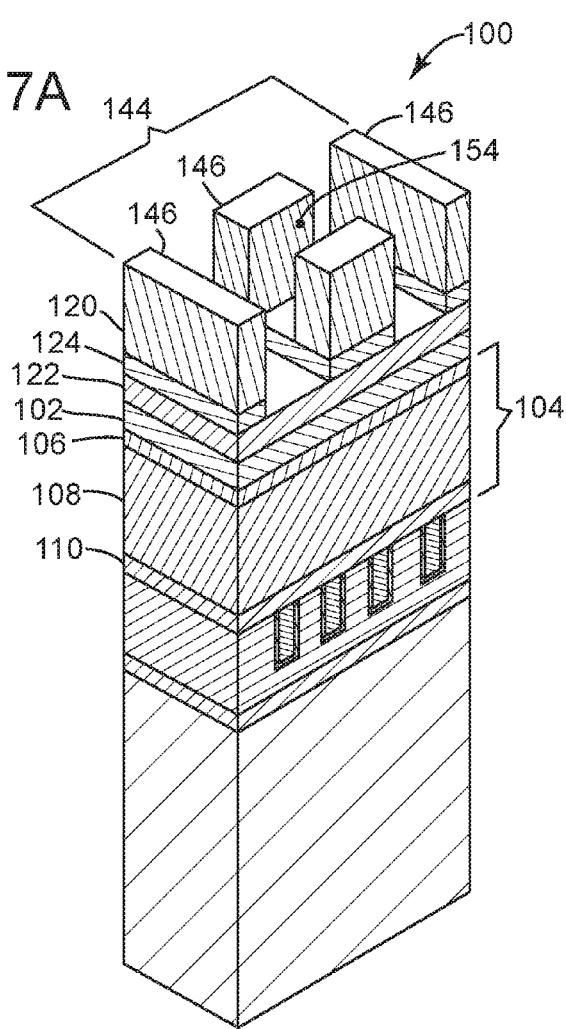

APPARATUS AND METHOD OF FORMING SELF-ALIGNED CUTS IN MANDREL AND A NON-MANDREL LINES OF AN ARRAY OF METAL LINES

TECHNICAL FIELD

The present invention relates to semiconductor devices and methods of making the same. More specifically, the invention relates to methods of making multiple closely located cuts on a single metal line of an integrated circuit through the use of a single cut mask.

BACKGROUND

Self-aligned double patterning (SADP) techniques, are currently used in ultra-high density integrated circuits to provide an electrical interconnection system which includes multiple arrays of parallel metal lines disposed in several levels of dielectric layers. The dielectric layers are typically interconnected through a system of metalized vias. Conventionally, within an array of metal lines, the direction longitudinal to the metal lines is designated the "Y" direction and the direction perpendicular, or lateral, to the metal lines is designated the "X" direction.

Such SADP techniques typically involve the use of a lithographic mask (designated herein as a "mandrel mask") to pattern and print an array of longitudinally extending parallel mandrels onto a top surface of a hardmask layer. The longitudinal direction of the mandrels defines the Y direction of the array. Spacers are then formed on both sidewalls of each mandrel. The spacers are considered to be self-aligned in the X direction (perpendicular to the Y direction) because the spacing between the spacers in the X direction was defined by the sidewalls of the existing mandrels.

Each combination of mandrel and associated spacer pair is separated by exposed parallel portions of the hardmask layer, which are absent any overlaying mandrels or spacers. The mandrels are patterned down into a dielectric layer of the integrated circuit to form mandrel metal lines. The exposed portions of the hardmask layer are also patterned down into the dielectric layer to form non-mandrel metal lines. Therefore, each array of parallel metal lines in an interconnection system formed using an SADP process will include alternating mandrel and non-mandrel metal lines, which are separated by a distance equal to the width of the self-aligned spacers.

In order to provide functionality between devices, such as transistors, capacitors and the like, in the integrated circuit, a plurality of cuts must be lithographically patterned into the mandrel and non-mandrel metal lines of an array at specific locations to direct current flow between the dielectric layers and the devices. Generally, another lithographic mask (designated herein as a "mandrel line cut mask") is used to pattern such mandrel cuts into the mandrel metal lines. Also generally yet another lithographic masks (designated herein as a "non-mandrel line cut mask") is used to pattern such non-mandrel cuts into the non-mandrel metal lines.

Accordingly, a typical SADP process for patterning arrays of metal lines in a complex interconnection system for an integrated circuit requires at least three masks: a mandrel mask, a mandrel line cut mask, and a non-mandrel line cut mask. Development and use of such masks requires complex, state of the art technology, especially when lithographically printing aggressively small features in such technology class sizes as the 14 nanometer (nm) class and beyond. Therefore it is desirable to keep the number of masks to a minimum due to the large costs associated with the development and use of such masks.

However, there is often a requirement for multiple cuts located closely together along the Y direction (the longitudinal direction) of a single mandrel or non-mandrel line within an array. Problematically the prior art optical limit for lithographically patterning two cuts next to one another with the same cut mask is about 100 nanometers from center to center of the cuts. Therefore, if such cuts are located less than 100 nm apart in the Y direction on the same line, each cut will require a separate cut mask using prior art lithographic techniques. Moreover, costs and logistic complexities increase rapidly as the number of closely located cuts increase beyond two per line and, therefore, the number of cut masks also increase. Additionally, the cuts in a single line are not self-aligned in the Y direction, which exacerbate lithographic tolerance issues.

In many devices, such as static random access memory (SRAM) cells and other similar logic devices, closely located multiple cuts per single line are required in both the mandrel lines and non-mandrel lines of an array.

Accordingly, there is a need to be able to provide multiple cuts in a single metal line of an array of metal lines for an integrated circuit that are located closer than 100 nm apart in the Y direction through the use of a single cut mask. Additionally, there is a need to provide self-aligned cuts located closer than 100 nm in the Y direction. More specifically, there is a need to be able to provide multiple cuts in both the mandrel and non-mandrel lines of an array of metal lines for an integrated circuit that are located less than 100 nm apart and self-aligned in the Y direction through the use of a single mandrel line cut mask and/or a single non-mandrel line cut mask.

BRIEF DESCRIPTION

The present invention offers advantages and alternatives over the prior art by providing an apparatus and method of forming pairs of cuts in a mandrel or non-mandrel metal line, or both, for an integrated circuit. The metal lines extend longitudinally in a Y direction and are self-aligned in a perpendicular X direction. The cuts of a pair of cuts are formed closer than 100 nm apart in the Y direction on any single metal line through the use of a single mandrel line cut mask and/or a single non-mandrel line cut mask. Additionally the cuts of any pair of cuts on any single metal line are self-aligned in the Y direction.

A method in accordance with one or more aspects of the present invention includes providing a structure having a first hardmask layer, second hardmask layer, third hardmask layer and mandrel layer disposed respectively over a dielectric stack. An array of mandrels is then patterned into the mandrel layer. A beta trench is patterned into the mandrels. A gamma trench is patterned into the second hardmask layer. Self-aligned first inner spacers are formed on sidewalls of the beta trench. Self-aligned second inner spaces are formed on sidewalls of the gamma trench. The first and second inner spaces form a portion of a pattern. The pattern is etched into the dielectric stack to form an array of alternating mandrel and non-mandrel metal lines extending longitudinally in a Y direction and being self-aligned in a perpendicular X direction. The portion of the pattern formed by the first and second inner spaces forms a first pair of mandrel line cuts in a mandrel line and a second pair of non-mandrel line cuts in a non-mandrel line respectively. The first and second pair of line cuts are self-aligned in the Y direction.

In another aspect of the present invention, the method includes providing a structure having a first hardmask layer, second hardmask layer, third hardmask layer and mandrel layer disposed respectively over a dielectric stack. An array of mandrels is patterned into the mandrel layer. One of a gamma trench into the mandrels and a beta trench into the second hardmask layer is then patterned. Self-aligned first inner spacers are formed on sidewalls of the one of the gamma trench and the beta trench. The first inner spacers form a portion of a pattern. The pattern is etched into the dielectric stack to form an array of alternating mandrel and non-mandrel metal lines extending longitudinally in a Y direction and being self-aligned in a perpendicular X direction. The portion of the pattern formed by the first inner spacers forms a first pair of line cuts in one of a mandrel line and a non-mandrel line. The cuts in the first pair of line cuts are separated by a center-to-center distance of less than 100 nm and are self-aligned in the Y direction.

In another aspect of the present invention, a structure for an integrated circuit includes a dielectric layer. An array of metal lines is disposed in the dielectric layer. The array includes alternating parallel mandrel and non-mandrel metal lines extending longitudinally in a Y direction and being self-aligned in a perpendicular X direction. The array also includes one of a pair of mandrel line cuts disposed in a mandrel line of the array and a pair of non-mandrel line cuts disposed in a non-mandrel line of the array. The cuts in the one of the pair of mandrel line cuts and the pair of non-mandrel line cuts are separated by a center-to center distance of less than 100 nm and are self-aligned in the Y direction.

DRAWINGS

The invention will be more fully understood from the following detailed description taken in conjunction with the accompanying drawings, in which:

FIG. 7A is a perspective view of an exemplary embodiment of the structure of FIG. 6 having a beta trench in a mandrel in accordance with the present invention;

FIG. 7B is a perspective top view of FIG. 7A;

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

FIGS. 1-16 illustrate various exemplary embodiments of methods of forming cuts in mandrel and/or non-mandrel metal lines through the use of a single mandrel line cut mask and/or a single non-mandrel line cut mask respectively in accordance with the present invention.

Figure 1:
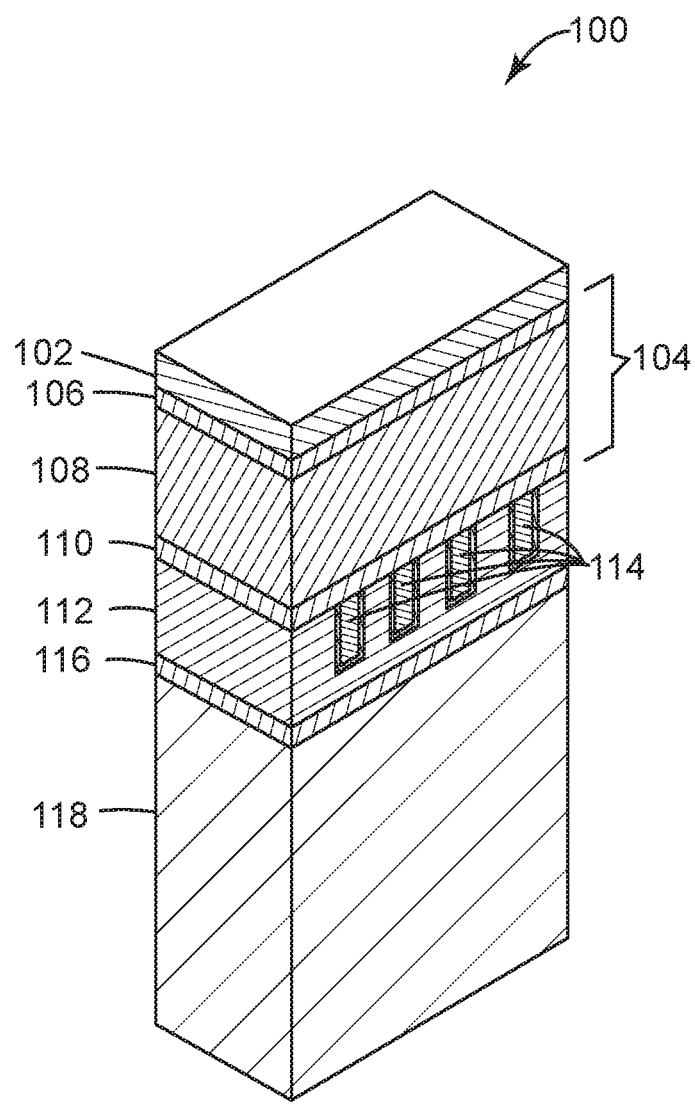
FIG. 1 is simplified perspective view of an exemplary embodiment of a structure for an integrated circuit device at an intermediate stage of manufacturing having a first hardmask layer disposed over a dielectric stack in accordance with the present invention.

Referring to FIG. 1, a simplified view of an exemplary embodiment of a structure 100 for an integrated circuit device in accordance with the present invention is presented at an intermediate stage of manufacturing. Structure 100 includes a titanium nitride (TiN) first hardmask layer 102 disposed over a dielectric stack 104. The dielectric stack 104 may include many different combinations of layers depending on such factors as application requirements, cost, design preferences and the like. In this exemplary embodiment, the dielectric stack 104 includes a first silicon oxynitride dielectric layer (first SiON dielectric layer) 106 disposed over a low dielectric constant (k) layer 108, such as a dielectric layer composed of various combinations of silicon, carbon, oxygen and hydrogen (an SiCOH layer). The low k dielectric layer 108 is disposed over an etch-stop layer 110, such as a silicon nitride (SiN) layer, which is also included in the dielectric stack 104.

The dielectric stack 104 is disposed over a metallization layer 112, which contains a plurality of interconnect lines 114 that make up a portion of an electrical interconnection system for structure 100. Metallization layer 112, in turn, is disposed over a second SiN etch stop layer 116. The second etch stop layer 116 is disposed over a complex stack of buried layers 118 from the substrate (not shown) upwards.

Figure 2:
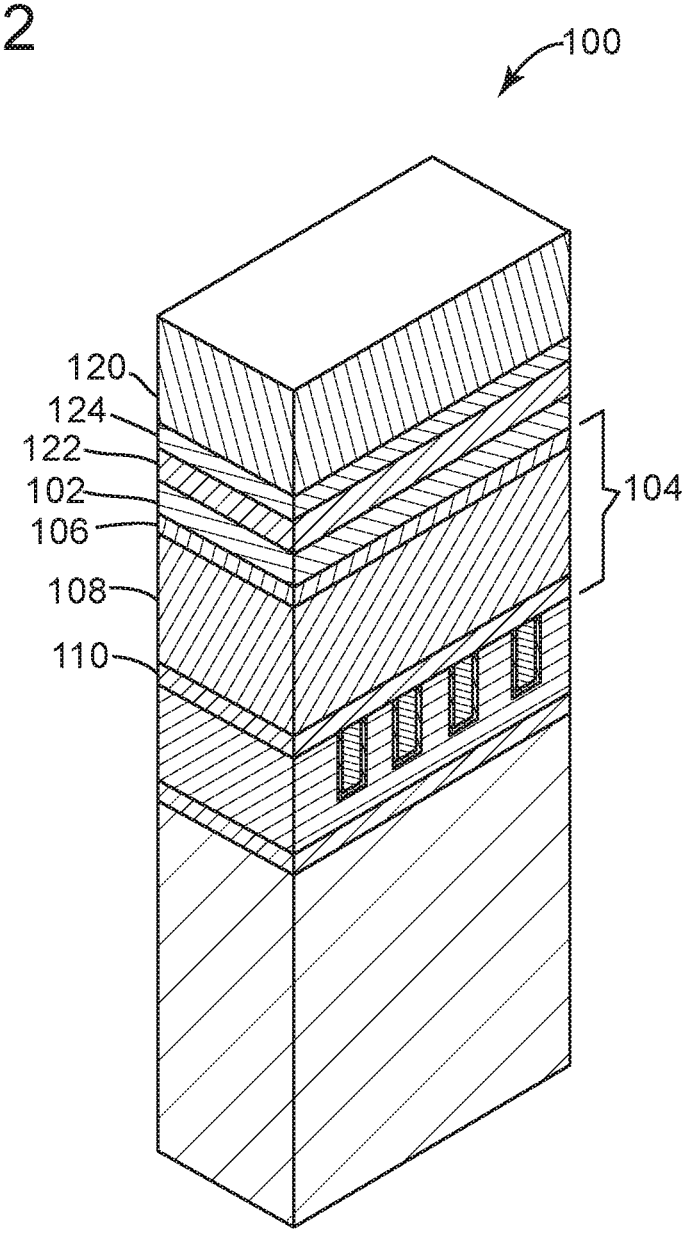
FIG. 2 is a perspective view of an exemplary embodiment of the structure of FIG. 1 having a mandrel layer and a second hardmask layer and a third hardmask layer disposed respectively on the first hardmask layer in accordance with the present invention.

Referring to FIG. 2, a second hardmask layer 122, composed of SiN, is disposed over first hardmask layer 102. Next a third hardmask layer 124, composed of a material such as TiN, is disposed over the second hardmask layer 122. Then a mandrel layer 120, composed of an amorphous silicon (a-Si), is disposed over the third hardmask layer 124.

As will be discussed in greater detail herein, the combination of the three hardmask layers 102, 122 and 124, provides the ability to etch both beta trenches 154 and gamma trenches 164 (best seen in FIG. 9) that will ultimately be used to form self-aligned mandrel line cuts 210, 213 and non-mandrel line cuts 214, 216 respectively (best seen in FIG. 16). It is important to note that the first hardmask layer 102 and the third hardmask layer 124 must be different enough from the second hardmask layer 122 to be etch selective relative to such second hardmask layer 122. In this case, TiN has been selected for the first and third hardmask layers 102, 124 and SiN has been selected for the second (middle) hardmask layer 122. However, one skilled in the art would recognize that the first and third hardmask layers 102, 124 do not have to be the same material and that many other combinations of materials for the hardmask layers 102, 122 and 124 will work for this invention.

Figure 3:
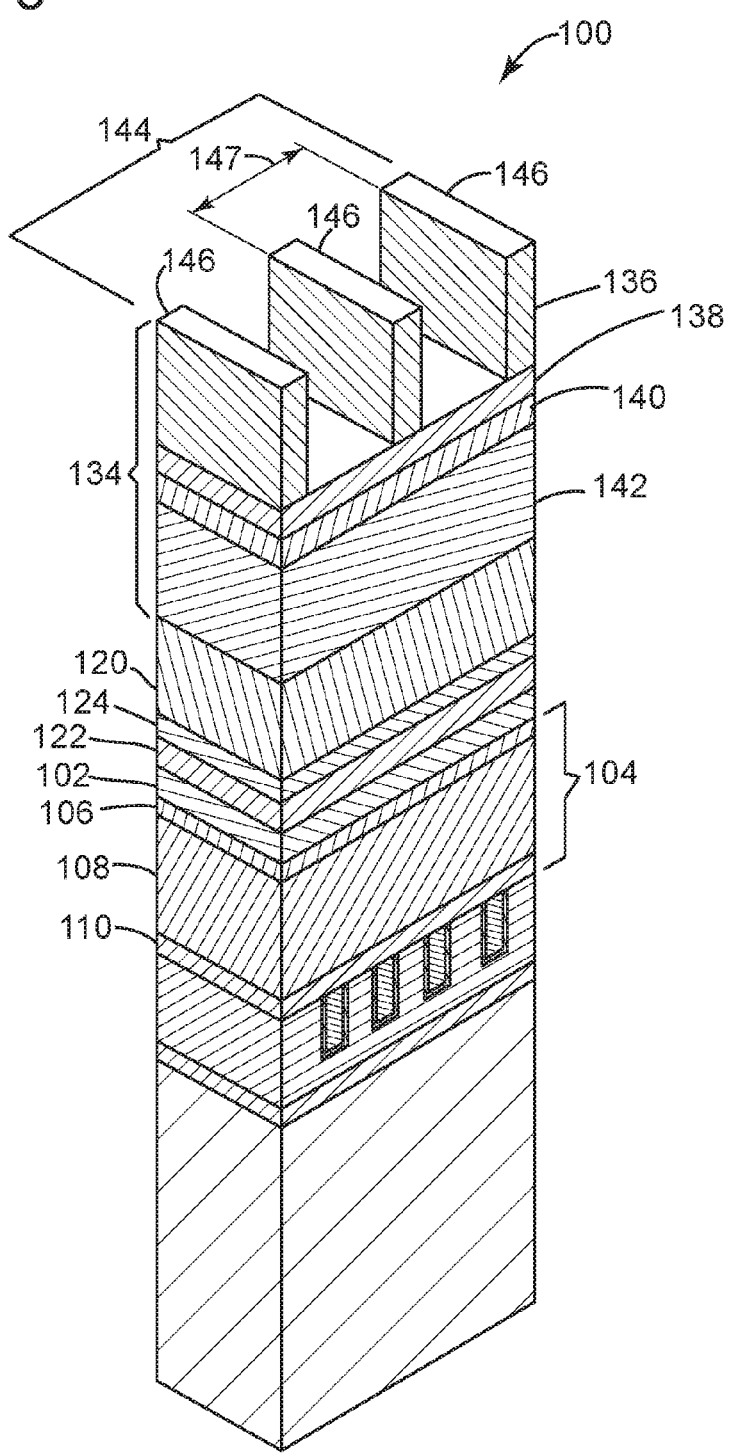
FIG. 3 is perspective view of an exemplary embodiment of the structure of FIG. 2 having a first mandrel lithographic stack with mandrels patterned thereon in accordance with the present invention.

Referring to FIG. 3, once the second hardmask layer 122, third hardmask layer 124 and mandrel layer 120 have been disposed respectively over the first hardmask layer 102, the next step is to dispose a first mandrel lithographic stack 134 onto the mandrel layer 120. The first mandrel lithographic stack 134 can be composed of several different kinds of layers, depending on such parameters as the application requirements, design or proprietary preferences or the like. One such stack of layers includes a stack of four thin films which includes (from top to bottom) a resist layer 136, a bottom antireflective coating (BARC) layer 138, a second SiON dielectric layer 140 and a spin-on hardmask (SOH) layer 142. This SOH layer 142 is typically made of amorphous carbon.

Once the stack 134 is disposed over the mandrel layer 120, a mandrel mask (not shown) is used to pattern and print a parallel array 144 of mandrels 146 into the resist layer 136 of the mandrel lithographic stack 134 through well-known lithographic techniques. Note that in this exemplary embodiment, a pitch 147 (i.e., the center to center distance between repetitive features on an integrated circuit) between mandrels is set at 80 nm.

Figure 4:
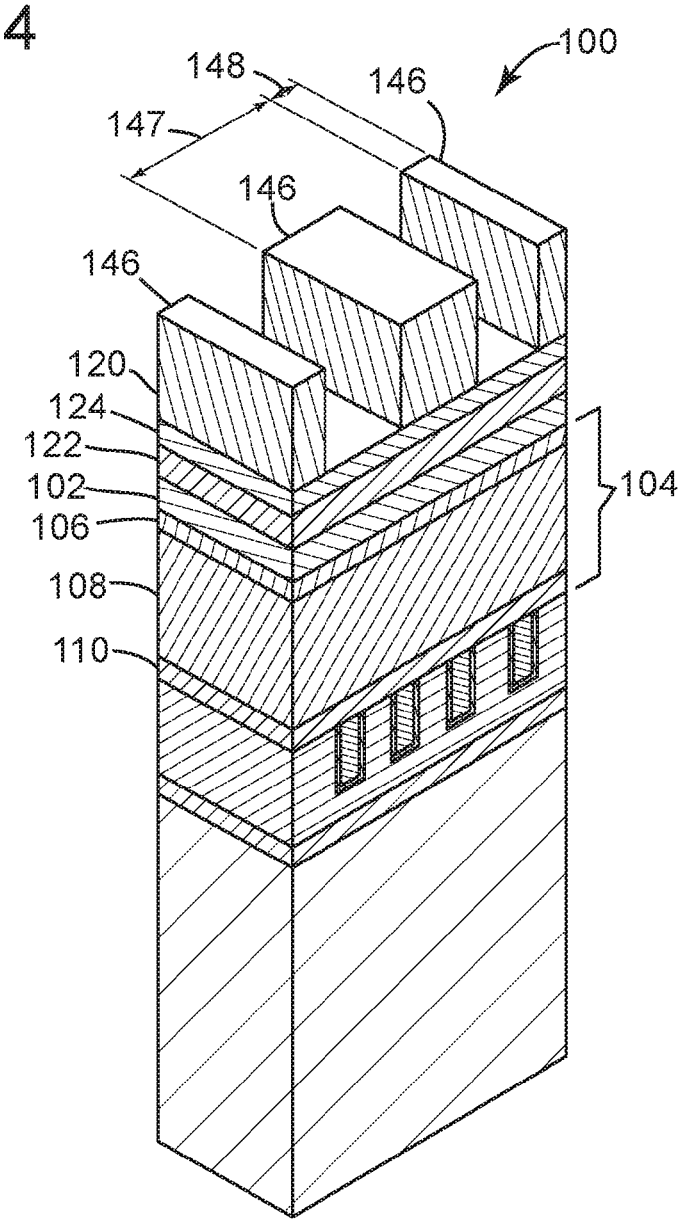
FIG. 4 is a perspective view of an exemplary embodiment of the structure of FIG. 3 having the mandrels patterned into the mandrel layer.

Referring to FIG. 4, the mandrels 146 are then etched and trimmed, by a variety of well-known processes, to reduce the width (indicated by arrow 148) of the mandrels 146 to, in this example, substantially 20 nm and to extend the mandrels down into the mandrel layer 120. At this stage of the process flow, even though the width 148 of the mandrels 146 has been reduced to 20 nm, the pitch 147 of 80 nm has not changed. It is important to note that the mandrels 146 will ultimately be utilized to form an array 200 of alternating mandrel metal lines 204, 208 and non-mandrel metal lines 202, 206 (best seen in FIG. 16) in the low-k dielectric layer 108.

The mandrel layer 120 (and therefore the mandrels 146), the second hardmask layer 122 and third hardmask layer 124 have different material compositions in order to be able to selectively etch features into each layer 120, 122, 124 in the remaining steps. In this particular exemplary embodiment, silicon nitride (SiN) was chosen for the material of the second hardmask layer 122, titanium nitride (TiN) was chosen for the material of the third hardmask layer and amorphous silicon (a-Si) was chosen for the material of the mandrels 146. However, one skilled in the art would recognize that many other materials can be used.

Figure 5:
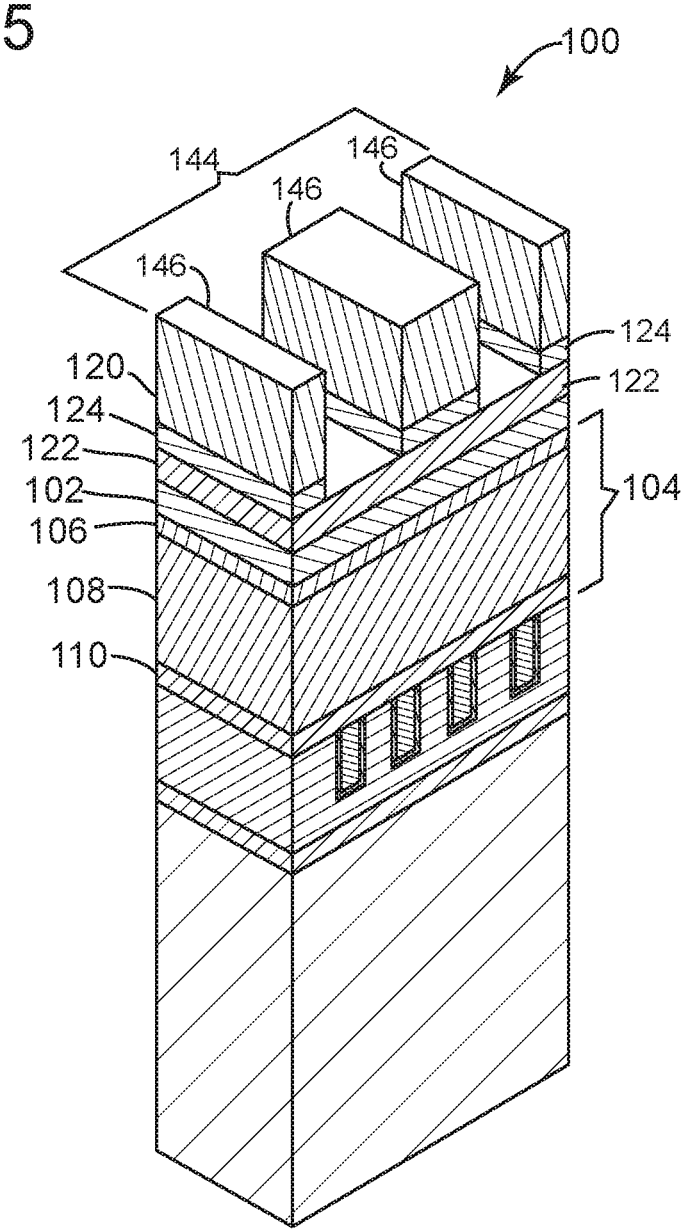
FIG. 5 is a perspective view of an exemplary embodiment of the structure of FIG. 4 having the mandrels patterned into the third hardmask layer.

Referring to FIG. 5, the mandrels 146, of the array of mandrels 144, are next patterned into the third hardmask layer 124 to expose the second hardmask layer 122 between the mandrels. This can be done by selectively anisotropically etching the TiN of the third hardmask layer 124 but not the amorphous silicon of the mandrel layer 120. Additionally, even though FIGS. 4 and 5 are shown as two separate steps, the same process can often do both. For example, a Reactive Ion Etch (RIE) anisotropic process can be employed to first etch the mandrels 146 into the mandrel layer with a first type of gas, then a second type of gas may be introduced during the same process to etch the mandrels 146 into the third hardmask layer 124.

Figure 9B:
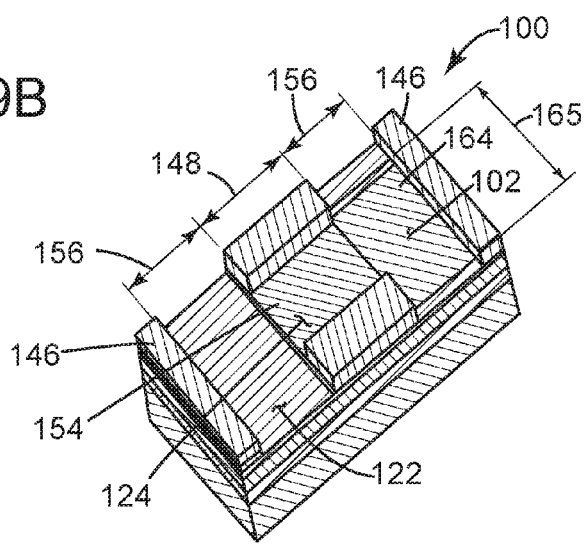
FIG. 9B is a perspective top view of FIG. 9A.
Figure 9A:
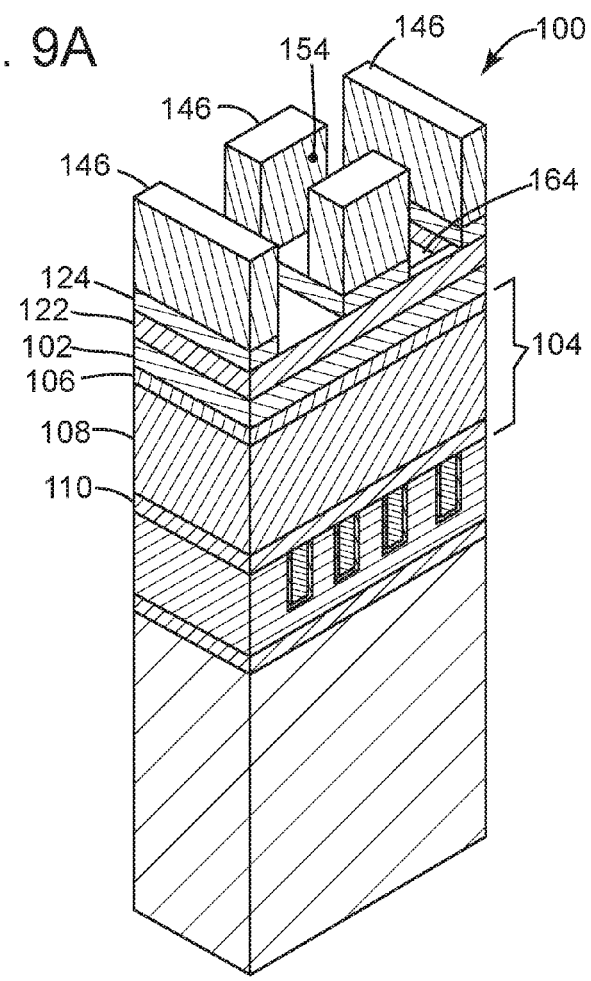
FIG. 9A is a perspective view of an exemplary embodiment of the structure of FIG. 8 having a gamma trench in the second hardmask layer in accordance with the present invention.

Etching the mandrels 146 into the third hardmask layer 124 and exposing the second hardmask layer 122 creates two different levels for the formation of beta (mandrel) trenches 154 and gamma (non-mandrel) trenches 164 (best seen in FIG. 9). The beta and gamma trenches 154, 164 will ultimately be used to form self-aligned mandrel line cuts 210, 211 and non-mandrel line cuts 214, 216 respectively in the dielectric layer 108 of the dielectric stack 104 (best seen in FIG. 16).

Figure 6:
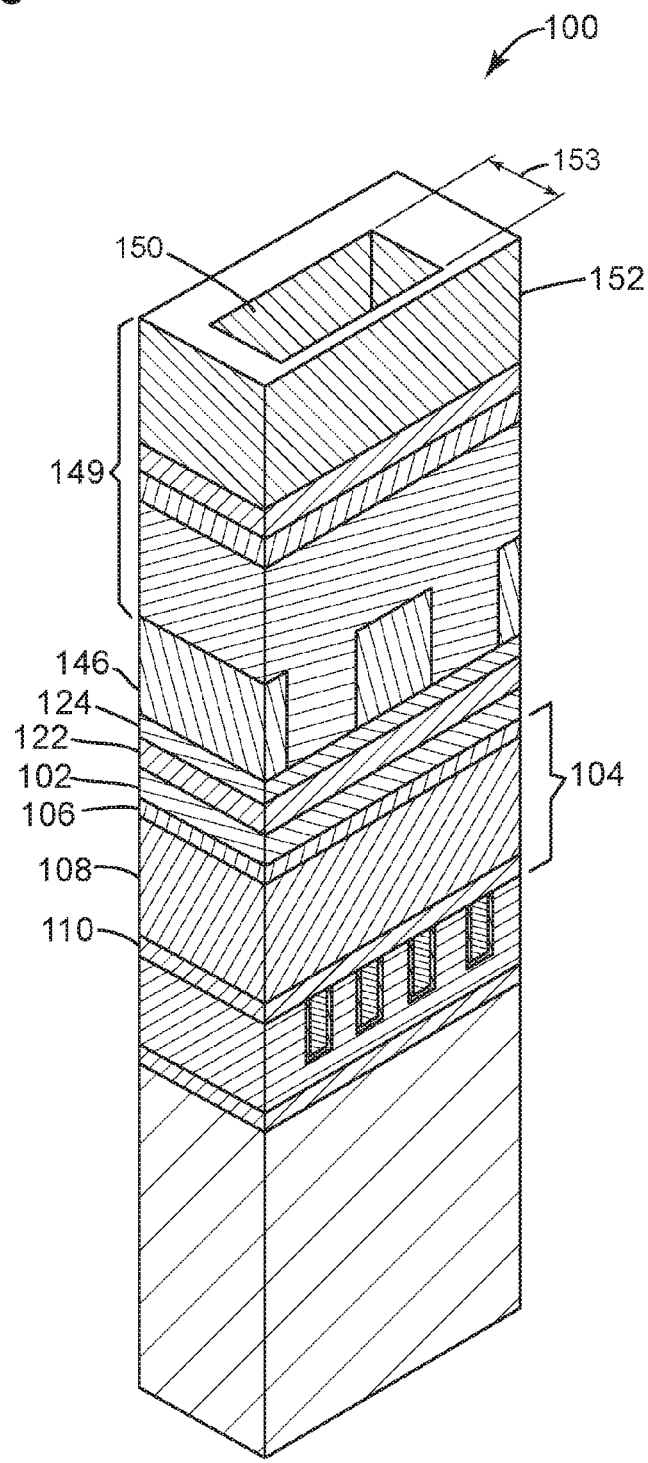
FIG. 6 is a perspective view of an exemplary embodiment of the structure of FIG. 5 having a second beta lithographic stack with a beta opening patterned therein in accordance with the present invention.

Referring to FIG. 6, a second beta lithographic stack 149 is disposed over the structure 100. Next a first mandrel line cut mask (not shown) is used to pattern and print a beta opening 150 into a predetermined location of resist layer 152 of stack 149.

Figure 16:
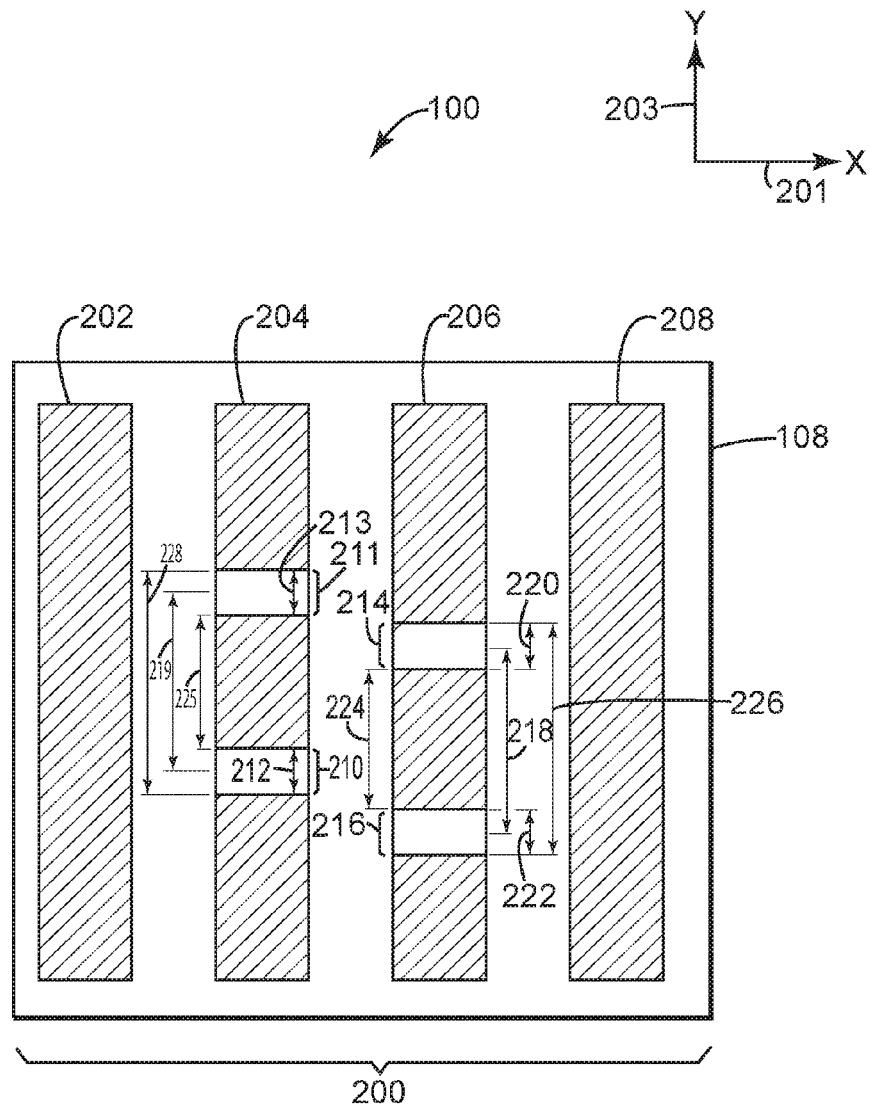
FIG. 16 is a top view of the structure of FIG. 15A having the pattern etched into a dielectric layer of the dielectric stack to form an array of alternating mandrel and non-mandrel metal lines in accordance with the present invention.

It is important to note that the beta opening 150 will ultimately be utilized to pattern a first mandrel line cut 210 and a second mandrel line cut 211, which are collectively referred to herein as a first pair of mandrel line cuts 210, 211 (best seen in FIG. 16). The first pair of mandrel line cuts 210, 211 will be disposed in a selected mandrel line 204 of the array 200 of metal lines 202, 204, 206 and 208 (herein 202-208). The first pair of mandrel line cuts 210, 211 will be self-aligned in the Y direction 203 (best seen in FIG. 16) and spaced apart by a center-to-center distance 219 in the Y direction that is less than 100 nm. As such, the width 153 of the beta opening 150 must be substantially equal to the combined width 228 (best seen in FIG. 16) of the width 212 of the first mandrel line cut 210 plus the width 213 of the second mandrel line cut 211 plus the edge-to-edge distance 225 between the cuts 210, 211. Assuming that the mandrel line cut widths 212 and 213 are substantially equal, then it can be said that the width 153 of the beta opening 150 (as well as the combined width 228 as illustrated in FIG. 16) is substantially equal to the width of a mandrel line cut (210 or 211) plus the center-to-center distance 219 between the cuts 210, 211. Additionally, the beta opening 150 is positioned such that it is located directly above the selected mandrel line 204 and extends laterally in the X direction 201 (best seen in FIG. 16) across the entire width of the selected mandrel line 204.

It is important to note that there are applications, such as in the case of SRAM cells, where there may be no mandrel line cuts required. In such cases, there would be no need for a second beta lithographic stack 149 or the patterning of a beta opening 150 and the process flow can skip to FIG. 8.

Referring to FIGS. 7 A and B, once the lithographic process is complete and the beta opening 150 is notched into the resist layer 152, an anisotropic etch process, such as a reactive ion etch (RIE), is utilized to selectively etch a beta trench 154 entirely in a mandrel 146 of the array 144. The shape of the beta trench 154 will eventually be altered and further patterned down to the low k dielectric layer 108 to form the first pair of mandrel line cuts 210, 211 discussed earlier.

Because the material composition of the mandrels 146, third hardmask layer 124 and second hardmask layer 122 are different, the etching process which formed beta trench 154 can be selected such that it affects only the a-Si mandrels 146 and not the TiN third hardmask layer 124 or the SiN second hardmask layer 122. Because the pitch is still 80 nm, the overlay control of the lithographic process, which was used to size and locate the beta trench 154, is accurate enough to prevent the etching process from over extending in the X direction past the entire width (as indicated by width arrow 156) of the exposed second hardmask layer 122 between mandrels 146, making this etch self-aligned.

Figure 8:
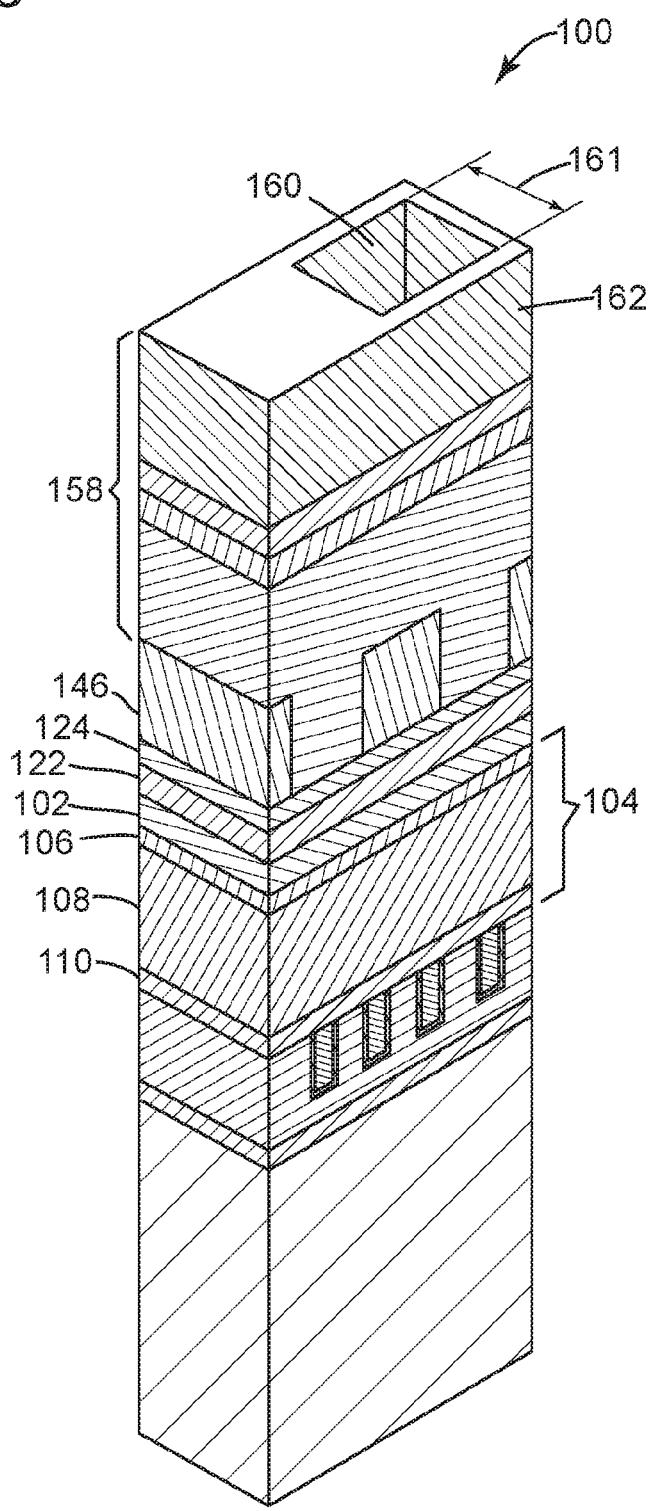
FIG. 8 is a perspective view of an exemplary embodiment of the structure of FIG. 7A having a third gamma lithographic stack with a gamma opening patterned therein in accordance with the present invention.

Referring to FIG. 8, a third gamma lithographic stack 158 is disposed over the structure 100. Next a second non-mandrel line cut mask (not shown) is used to pattern and print a gamma opening 160 into a predetermined location of resist layer 162 of the stack 158.

It is important to note that the gamma opening 160 will ultimately be utilized to pattern a first non-mandrel line cut 214 and a second non-mandrel line cut 216, which are collectively referred to herein as a second pair of non-mandrel cut lines 214, 216 (best seen in FIG. 16). The second pair of non-mandrel line cuts 214, 216 will be disposed in a selected non-mandrel line 206 of the metal line array 200. The pair of cuts 214, 216 will be self-aligned in the Y direction 203 (best seen in FIG. 16) and spaced apart by a center-to-center distance 218 in the Y direction that is less than 100 nm. As such, the width 161 of the gamma opening 160 must be substantially equal to the combined width 226 (best seen in FIG. 16) of the width 220 of the first non-mandrel line cut 214 plus the width 222 of the second non-mandrel line cut 216 plus the edge-to-edge distance 224 between the cuts 214, 216. Assuming that the non-mandrel line cut widths 220 and 222 are substantially equal, then it can be said that the width 161 of the gamma opening 160 (as well as the combined width 226 as illustrated in FIG. 16) is substantially equal to the width of a non-mandrel line cut (220 or 222) plus the center-to-center distance 218 between the cuts 214, 216.

It is also important to note that there are applications, such as in the case of SRAM cells, where there may be only mandrel line cuts required. In such cases, there would be no need for a third gamma lithographic stack 158 or the patterning of a gamma opening 160 and the process flow can skip to FIG. 10.

Referring to FIGS. 9 A and B, once the third lithographic process is complete and the gamma opening 160 is notched into the resist layer 162, another anisotropic etch process, such as a RIE, is utilized to selectively etch a gamma trench 164 entirely into and through the second hardmask layer 122 to expose the top surface of the first hardmask layer 102 (best seen in FIG. 9B). More precisely the gamma trench 164 is etched in the exposed area of second hardmask layer 122 between the mandrels 146 and extends down to the top surface of the first hardmask layer 102. The gamma trench 164 is substantially equal in width 165 to the width 156 of exposed second hardmask layer. The shape of the gamma trench 164 will eventually be further altered and patterned down to the low k dielectric layer 108 to form the self-aligned second pair of non-mandrel line cuts 214 and 216 discussed earlier.

Because the material composition of the mandrels 146, third hardmask layer 124 and second hardmask layer 122 are different, the etching process which formed gamma trench 164 can be selected such that it affects only the SiN second hardmask layer 122 and not the a-Si mandrels 146 or the TiN third hardmask layer 124. Because the pitch is still 80 nm, the overlay control of the lithographic process, which was used to size and locate the gamma trench 164, is accurate enough to prevent the etching process from over extending in the X direction past the entire width 156 of the exposed second hardmask layer 122 between mandrels 146 plus the width 148 of the two adjacent mandrels 146.

Figure 10:
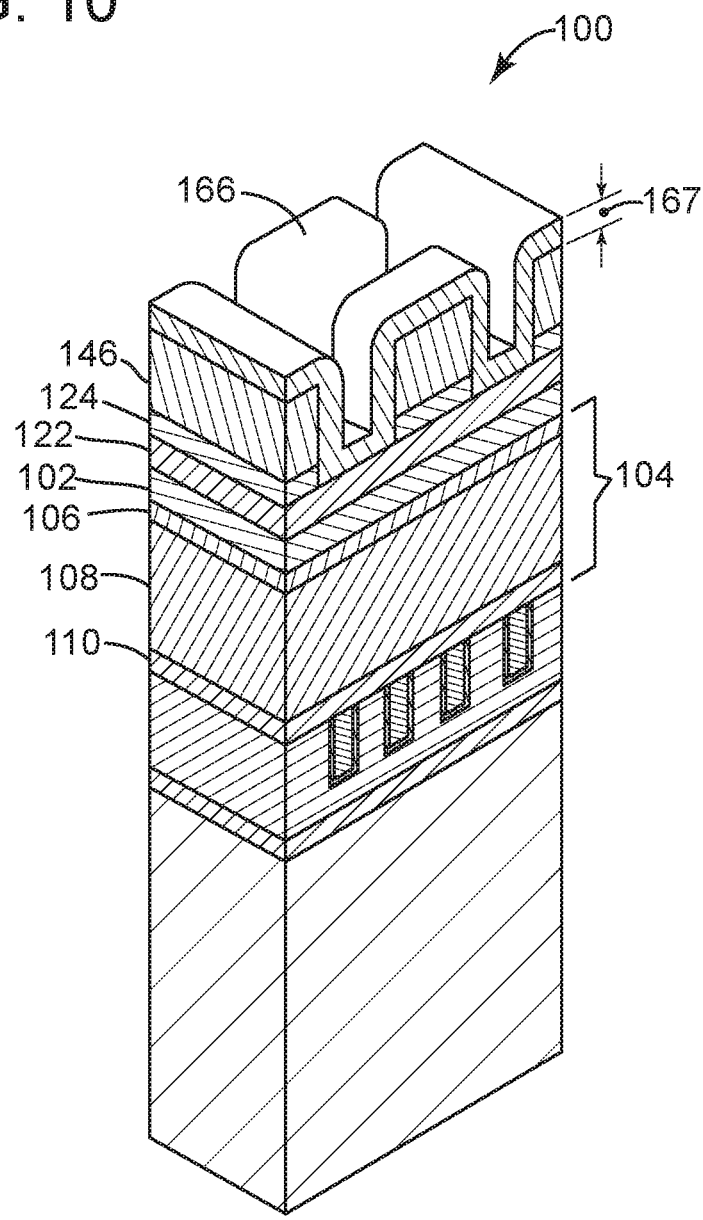
FIG. 10 is a perspective view of the structure of FIG. 9A having a spacer layer disposed thereon in accordance with the present invention.

Referring to FIG. 10, next a spacer layer 166, having a substantially uniform spacer layer thickness 167, is disposed over the structure 100. The spacer layer 166, in this example, is a silicon dioxide (SiO2) thin film, which is conformally coated over the mandrels 146, exposed third hardmask layer 124 within the beta trench 154, exposed second hardmask layer 122 and exposed first hardmask layer 102 within the gamma trench 164. The SiO2 material composition of the spacer layer 166 was chosen to be different from that of the mandrel layer 120, third hardmask layer 124 and second hardmask layer 122. Other materials for the spacer layer 166 may also be used. However, it is highly desirable that the material composition of the spacer layer 166 be different enough to enable selective etching between any combination of the mandrel layer 120 (and therefore the mandrels 146), the third hardmask layer 124, the second hardmask layer 122 and the spacer layer 166.

It is important to note that the spacer layer 166 does not fill and plug the beta trench 154 and gamma trench 164. Rather the spacer layer 166 conformally coats the floor of the gamma trench 164 (i.e., the top surface of the first hardmask layer 102 within the gamma trench 164) without completely plugging the gamma trench 164. Additionally, the spacer layer 166 conformally coats the floor of the beta trench 154 (i.e., the top surface of the third hardmask layer 124 within the beta trench 154) without completely plugging the beta trench 154. The spacer layer 166 can be applied by a deposition process, such as an atomic layer deposition (ALD) process, which can precisely control the spacer layer thickness 167. In this embodiment, the spacer layer thickness is controlled to substantially 20 nm.

Figure 11B:
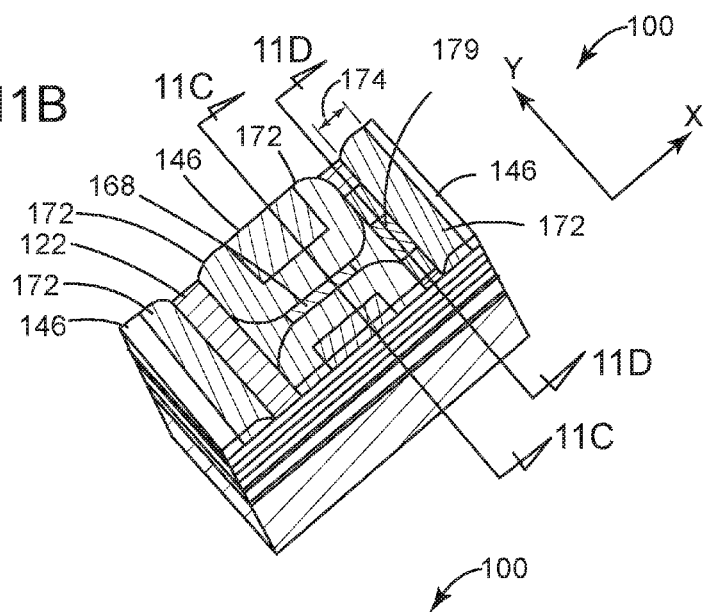
FIG. 11B is a perspective top view of FIG. 11A.
Figure 11A:
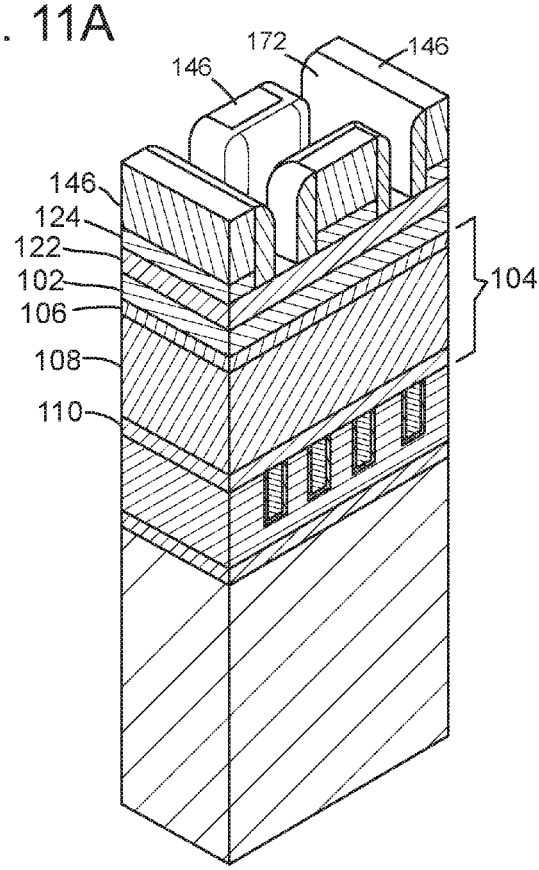
FIG. 11A is a perspective view of the structure of FIG. 10 having the spacer layer anisotropically etched in accordance with the present invention.
Figure 11C:
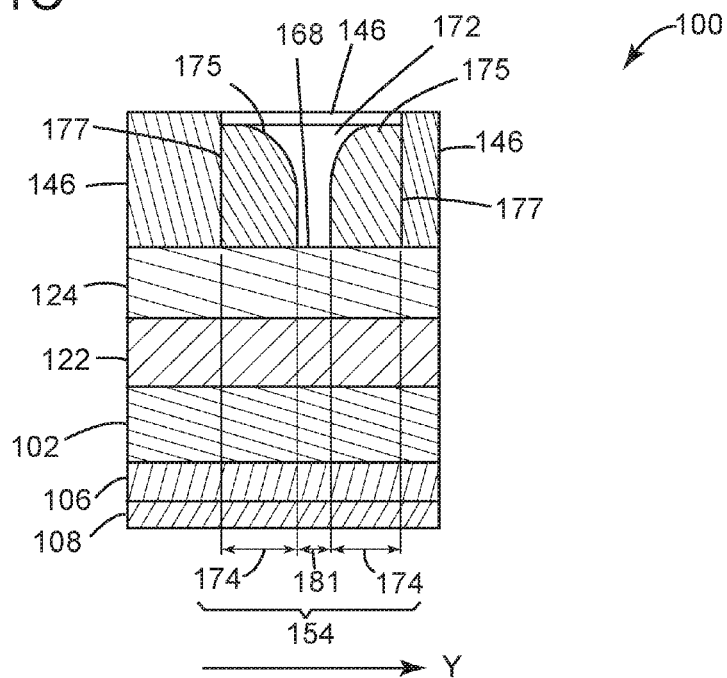
FIG. 11C is an expanded cross-sectional side view of a beta trench along a Y direction of FIG. 11B taken along the cross-sectional line 11C-11C.
Figure 11D:
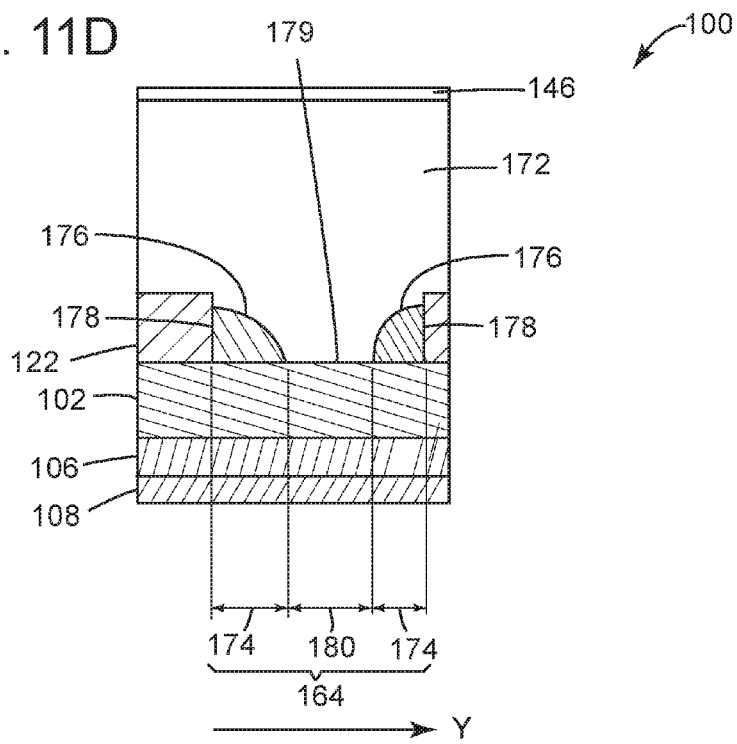
FIG. 11D is an expanded cross-sectional side view of a gamma trench along an Y direction of FIG. 11B taken along the cross-sectional line 11D-11D.

Referring to FIGS. 11A, B, C and D, wherein: FIG. 11A is a perspective view of the structure 100 of FIG. 10 after being anisotropically etched and FIG. 11B is a perspective top view of FIG. 11A. FIG. 11C is an expanded cross-sectional side view of beta trench 154 along the Y direction of FIG. 11B taken along the cross-sectional line 11C-11C. FIG. 11D is an expanded cross-sectional side view of gamma trench 164 along the Y direction of FIG. 11B taken along the cross-sectional line 11D-11D.

The spacer layer 166 is anisotropically etched, such as by a RIE process, to expose a portions of the top surface of the second hardmask layer 122 and to expose the upper surface of the mandrels 146. The anisotropic etch also exposes a portion 168 of the top surface of the third hardmask layer 124 within the beta trench 154 (best seen in FIG. 11C). The anisotropic etching process also exposes a portion 179 of the top surface of the first hardmask layer 102 within the gamma trench 164 (best seen in FIG. 11D).

Further the anisotropic etching process forms an array of first spacers 172 disposed on sidewalls of the mandrels 146 and extending longitudinally in the Y direction (best seen in FIG. 11B). Since the anisotropic etching process etches in the vertical direction only, the remaining first spacers have a spacer width 174 (best seen in FIG. 11B) that is substantially equal to the original spacer layer thickness 167 of 20 nm. Additionally, since the spacing between the spacers 172 is defined by the existing structure of the sidewalls of the mandrels 146 (best seen in FIG. 11B), the spacers 172 are considered to be self-aligned in the X direction.

Additionally, the anisotropic etching process forms a pair of first inner spacers 175 disposed on the inner sidewalls 177 of beta trench 154 (best seen in FIG. 11C). Because the spacing between the first inner spacers 175 is defined by the existing structure of the sidewalls 177 of beta trench 154, the first inner spacers 175 are considered to be self-aligned in the Y direction.

Moreover, the exposed portion 168 of the top surface of the third hardmask 124 separates the first inner spacers 175 by a predetermined edge-to-edge distance 181 in the Y direction. Accordingly, the exposed portion 168 of the third hardmask layer 124 within beta trench 154 forms the floor of beta trench 154. Again, because the anisotropic etching process etches in the vertical direction only, the first inner spacers 175 have the same spacer width 174 as the first spacers 172, which is substantially equal to the original spacer layer thickness 167 of 20 nm.

The anisotropic etching process also forms a pair of second inner spacers 176 disposed on inner sidewalls 178 of gamma trench 164 (best seen in FIG. 11D). Because the spacing between the inner spacers 176 is defined by the existing structure of the sidewalls 178 of gamma trench 164, the inner spacers 176 are considered to be self-aligned in the Y direction.

Additionally, the exposed portion 179 of the top surface of the first hardmask 102 separates the inner spacers 176 by a predetermined edge-to-edge distance 180 in the Y direction. Accordingly, the exposed portion 179 of top mask layer 102 within gamma trench 164 forms the floor of gamma trench 164. Again, because the anisotropic etching process etches in the vertical direction only, the second inner spacers 176 have the same spacer width 174 as the first spacers 172, which is substantially equal to the original spacer layer thickness 167 of 20 nm.

As will be explained in greater detail herein, the first inner spacers 175 will be used as blocks when patterning down to form the first and second mandrel line cuts 210 and 211, wherein the spacer width 174 will determine the mandrel line cut widths 212, 213 and the predetermined distance 181 between the first inner spacers 175 will determine the edge-to-edge distance 225 between the mandrel line cuts 210 and 211.

Further, the inner spacers 176 will be used as blocks when patterning down to form the first and second non-mandrel line cuts 214 and 216, wherein the spacer width 174 will determine the non-mandrel line cut widths 220, 222 and the predetermined distance 180 between the inner spacers 176 will determine the edge-to-edge distance 224 between the non-mandrel line cuts 214 and 216.

Advantageously, forming the mandrel line cuts 210, 211 and the non-mandrel line cuts 214, 216 from the self-aligned inner spacers 175, 176 is not limited by lithographic resolution. Therefore, the center-to-center distance 219 between the mandrel line cuts 210, 211, as well as the center-to-center distance 218 between the non-mandrel line cuts 214, 216, can be made much smaller than 100 nm. More specifically the center-to-center distances 219 and 218 between cuts 210, 211 and between cuts 214, 216 can be smaller than 50 nm or even smaller than 25 nm.

Figure 12B:
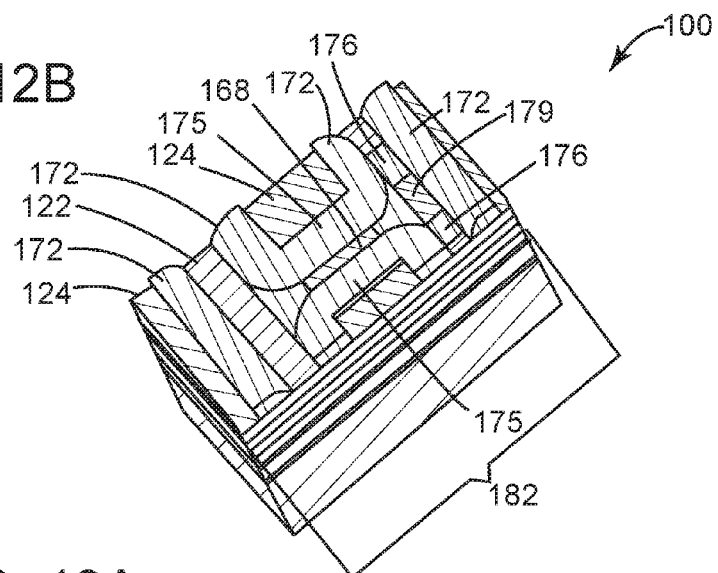
FIG. 12B is a top perspective view of FIG. 12A.
Figure 12A:
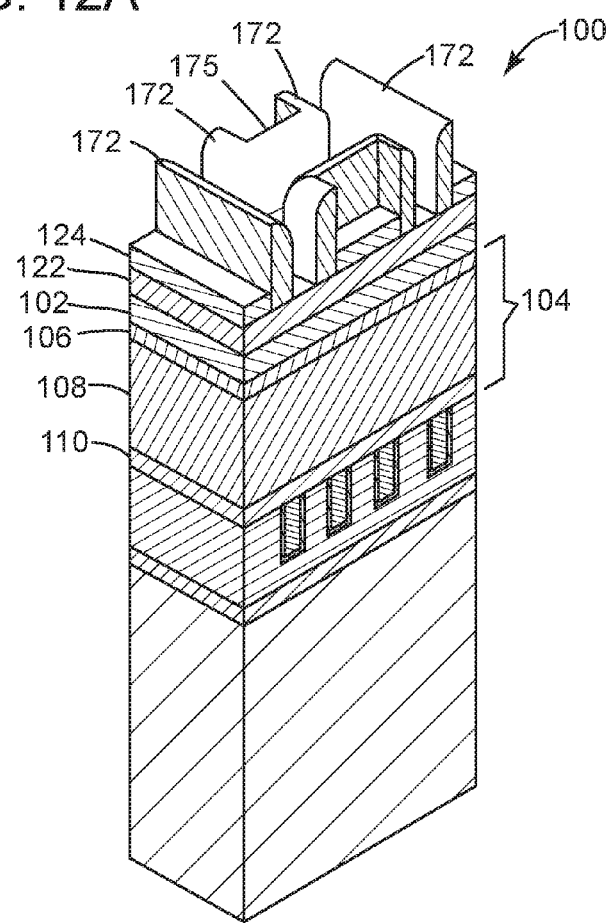
FIG. 12A is a perspective view of the structure of FIG. 11A having the mandrels anisotropically etched away to form a pattern in accordance with the present invention.

Referring to FIGS. 12A and B, the a-Si mandrels 146 are selectively etched away, leaving the first spacers 172, the first inner spacers 175 and the second inner spacers 176. The result of the etching process is that a pattern 182 of array 200 (best seen in FIG. 16) has emerged over the structure 100.

Referring specifically to FIG. 12B, which shows a top view of the pattern 182, the exposed portions of the second and third hardmask layers 122, 124 of pattern 182 will define the alternating mandrel metal lines 204, 208 and non-mandrel metal lines 202, 206 of array 200. The first spacers 172 of pattern 182 will define the distance between the metal lines 200-208. The first inner spacers 175 of pattern 182 will define the self-aligned mandrel line cuts 210 and 211. The edge-to-edge distance 181 of the exposed portion 168 of the third hardmask layer 124 of pattern 182 will define the edge-to-edge distance 225 between the mandrel line cuts 210, 211. The second inner spacers 176 of pattern 182 will define the self-aligned non-mandrel line cuts 214 and 216. Finally, the edge-to-edge distance 180 of the exposed portion 179 of the first hardmask layer 102 of pattern 182 will define the edge-to-edge distance 225 between the non-mandrel line cuts 214, 216.

Also, with the removal of the mandrels 146, the pitch of the array of first spacers 172 on structure 100 is now half the pitch of that of the array of mandrels 146. That is, the pitch has been halved from 80 nm to 40 nm on the structure 100. Though this example shows a mandrel pitch of 80 nm and a spacer pitch of 40 nm, one skilled in the art would recognize that this method of forming a pattern may be used with other pitches. For example, the mandrel array may have a pitch of 100 nm or less, and the spacer array may have a pitch of 50 nm or less.

Figure 13B:
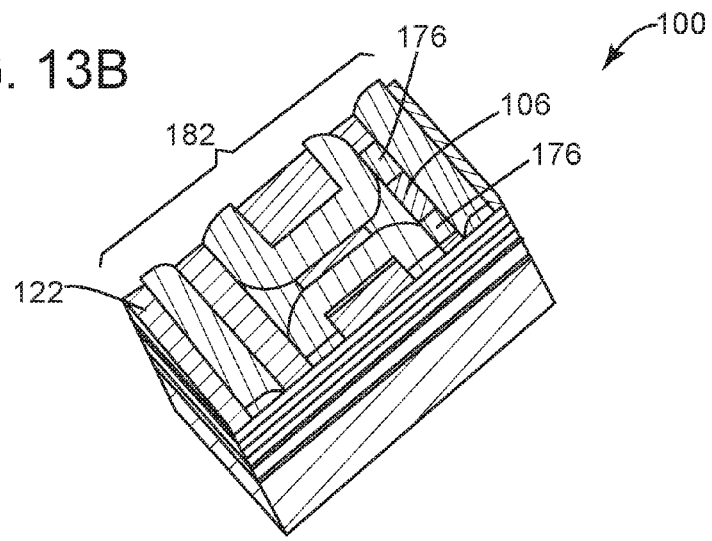
FIG. 13B is a top perspective view of FIG. 13A.
Figure 13A:
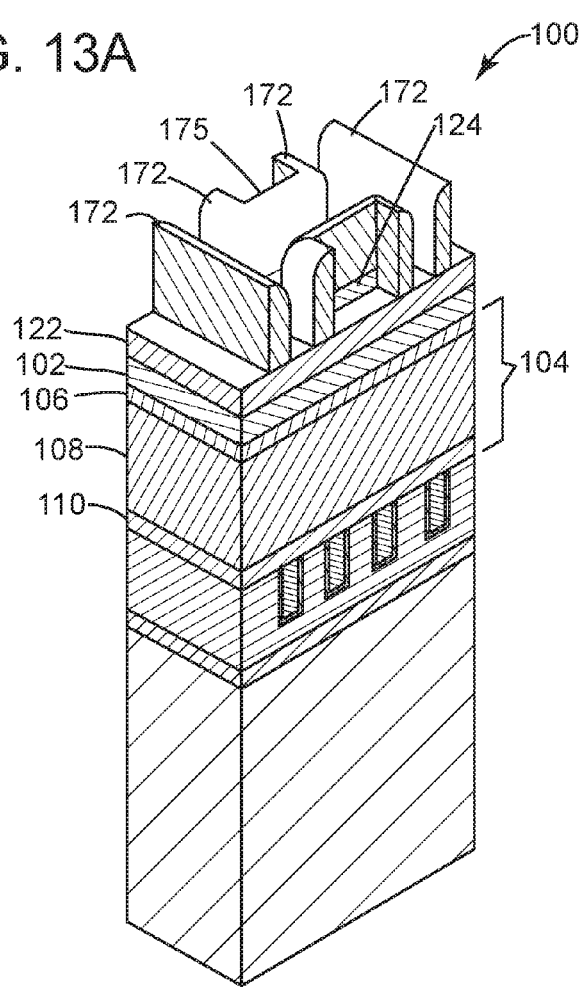
FIG. 13A is a perspective view of the structure of FIG. 12A having the exposed portion of the third hardmask layer anisotropically etched away in accordance with the present invention.
Figure 14B:
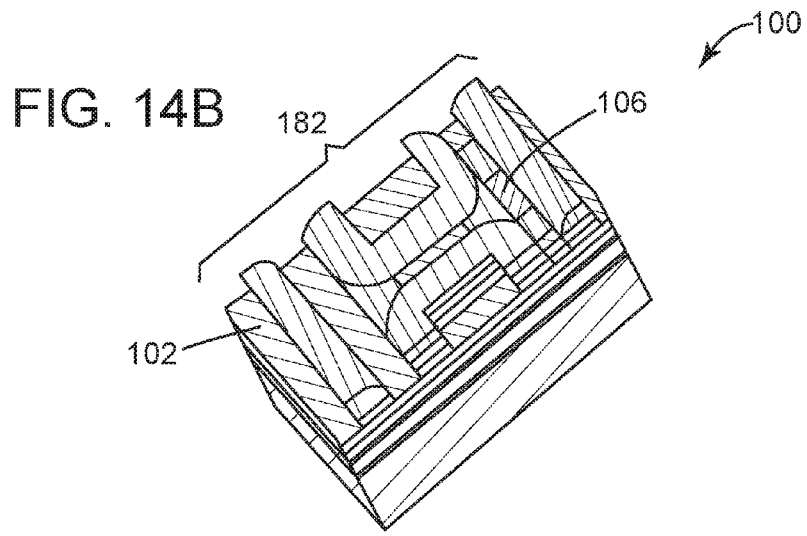
FIG. 14B is a top perspective view of FIG. 14A.
Figure 14A:
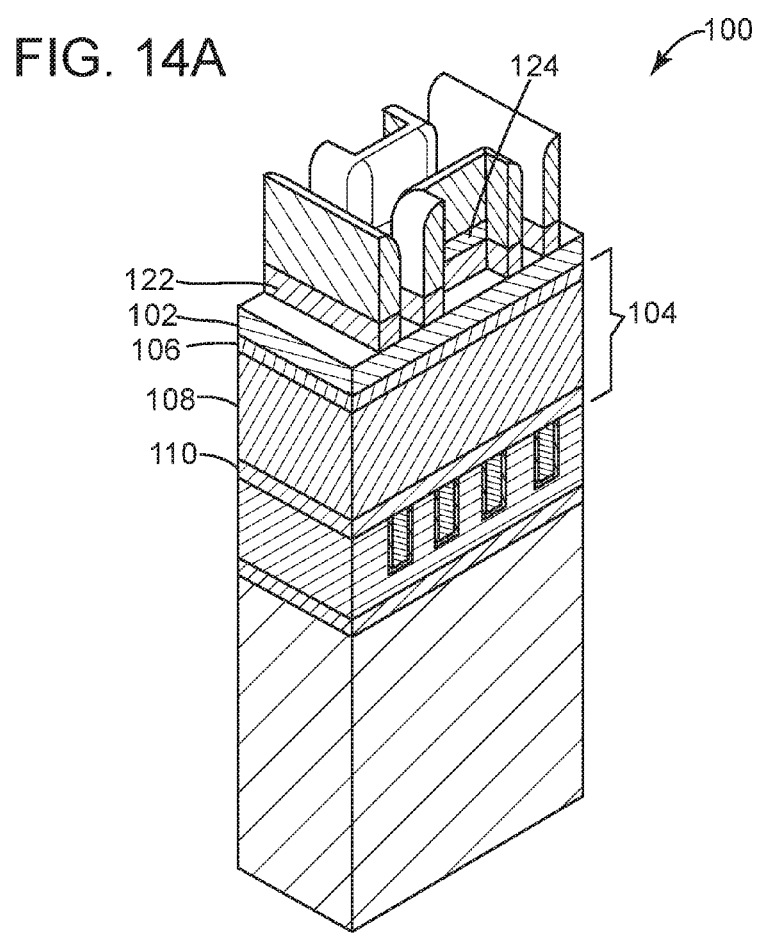
FIG. 14A is a perspective view of the structure of FIG. 13A having the exposed portion of the second hardmask layer anisotropically etched away in accordance with the present invention.
Figure 15B:
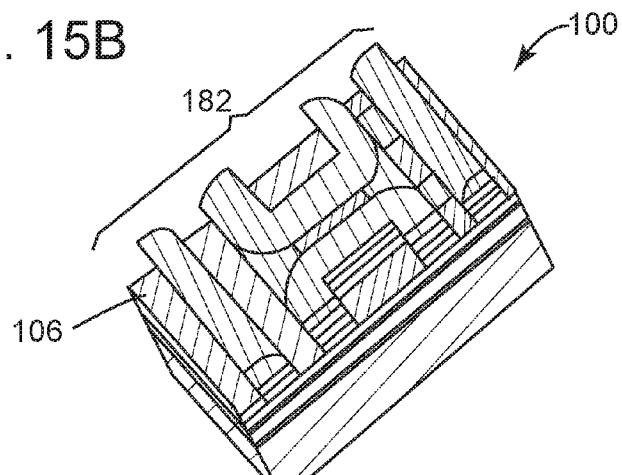
FIG. 15B is a top perspective view of FIG. 15A.
Figure 15A:
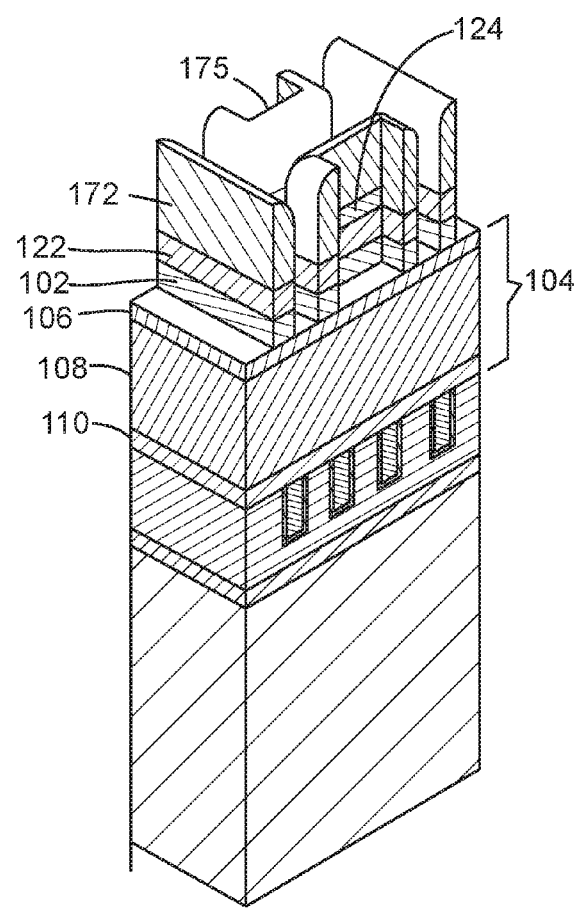
FIG. 15A is a perspective view of the structure of FIG. 14A having the exposed portion of the first hardmask layer anisotropically etched away in accordance with the present invention.

Referring to FIGS. 13A and 13B, the exposed portions of the TiN third hardmask layer 124, and the exposed TiN portion 179 of the first hardmask layer 102 within the gamma trench 164, are anisotropically etched away so that the pattern 182 now is primarily over the second hardmask layer 122. Referring to FIGS. 14 A and B, the exposed portions of second hardmask layer 122 are now anisotropically etched away so that the pattern 182 now is over the first hardmask layer 102. Referring next to FIGS. 15 A and B, the exposed portions of the first hardmask layer 102 are anisotropically etched away to form the pattern 182 directly over the first SION dielectric layer 106 of the dielectric stack 104.

An added benefit to this method of forming the pattern 182 is that the sequential selective etching to remove the a-Si mandrels 146, the exposed portions of the SiN second hardmask layer 122 and the exposed portions of the TiN first and third hardmask layers 102, 124 may be accomplished in a single integrated etch process. That is, through well-known RIE techniques, the composition of the reactive plasma of the RIE process can be changed as it penetrates through the mandrels 146, the third hardmask layer 124, the second hardmask layer 122 and the first hardmask layer 102 to stop at the first dielectric layer 106 at the top of the dielectric stack 104.

The first hardmask layer 102 is composed of TiN and is, therefore, very etch selective from that of the other materials above and below the hardmask layer 102. Therefore all other materials above the first hardmask layer 102 can be readily stripped away using well-known techniques to expose the pattern 182 in the TiN first hardmask layer. At this point in the process we are ready to etch the pattern 182 to form trenches (not shown) in the low k dielectric layer 108. The trenches will then be metalized to form the metal array 200 of FIG. 16.

Referring to FIG. 16, in this embodiment the metal line array 200 is a typical SRAM cell that is now formed into low k dielectric layer 108. The array includes the alternating mandrel metal lines 204, 208 and non-mandrel metal lines 202, 206, which are self-aligned in the X direction. In this exemplary embodiment, each metal line 202-208 is 20 nm thick and spaced apart a distance of 20 nm, therefore the repetitive pitch is 40 nm.

Mandrel line 204 now includes the two mandrel line cuts 210 and 211 (collectively, the first pair of mandrel line cuts), which have cut widths 212, 213 respectively that are substantially equal to the spacer layer width 167 and, therefore the spacer width 174. In this particular embodiment, the cut widths 212, 213 are substantially 20 nm. The first pair of mandrel line cuts 210 and 211 are advantageously self-aligned in the Y direction since they were formed from the previously self-aligned first inner spacers 175. Also advantageously, because the mandrel line cuts 210, 211 were formed from the self-aligned first inner spacers 175, their formation process was not limited by lithographic resolution. Therefore, the center-to-center distance 219 between the mandrel line cuts 210, 211 can be made much smaller than 100 nm. More specifically the center-to-center distance 219 between the first pair of mandrel line cuts 210, 211 can be smaller than 50 nm or even smaller than 25 nm.

Non-mandrel line 206 now includes the two non-mandrel line cuts 214 and 216 (collectively, the second pair of non-mandrel line cuts), which have cut widths 220, 222 respectively that are substantially equal to the spacer layer width 167 and, therefore the spacer width 174. In this particular embodiment, the cut widths 220, 222 are substantially 20 nm. The cuts 214 and 216 are advantageously self-aligned in the Y direction since they were formed from the previously self-aligned second inner spacers 176. Also advantageously, because the non-mandrel line cuts 214, 216 were formed from the self-aligned inner spacers 176, their formation process was not limited by lithographic resolution. Therefore, the center-to-center distance 218 between the non-mandrel line cuts 214, 216 can be made much smaller than 100 nm. More specifically the center-to-center distance 218 between cuts 214, 216 can be smaller than 50 nm or even smaller than 25 nm.

Also advantageously, the non-mandrel line cuts were formed through the use of a single non-mandrel line cut mask and the mandrel line cuts were formed through the use of a single mandrel line cut mask. No additional cut masks were used to make the separate non-mandrel line cuts or the separate mandrel line cuts. As a result, costs of additional cut masks were avoided as well as the associated lithographic overlay problems associated with the use of additional cut masks.

Moreover, this method of forming self-aligned line cuts provides the flexibility of forming either self-aligned mandrel line cuts, non-mandrel line cuts or both. More specifically, a beta trench 154 may be patterned into the mandrels 146 to form a first pair of mandrel line cuts 210, 211 and/or a gamma trench 164 may be patterned into the second hardmask layer 122 to form a second pair of non-mandrel line cuts 214, 216.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A method comprising:
   providing a structure having a first hardmask layer, second hardmask layer, third hardmask layer and mandrel layer disposed respectively over a dielectric stack;
   patterning an array of mandrels into the mandrel layer;
   patterning a beta trench into the mandrels;
   patterning a gamma trench into the second hardmask layer;
   forming self-aligned first inner spacers on sidewalls of the beta trench;
   forming self-aligned second inner spacers on sidewalls of the gamma trench, the first and second inner spacers forming a portion of a pattern; and
   etching the pattern into the dielectric stack to form an array of alternating mandrel and non-mandrel metal lines extending longitudinally in a Y direction and being self-aligned in a perpendicular X direction, the portion of the pattern formed by the first and second inner spacers forming a first pair of mandrel line cuts in a mandrel line and a second pair of non-mandrel line cuts in a non-mandrel line respectively, the first and second pair of line cuts being self-aligned in the Y direction.

2. The method of claim 1 wherein the cuts in each pair of mandrel and non-mandrel line cuts are separated by a center-to-center distance that is 100 nm or less.

3. The method of claim 1 wherein the cuts in each pair of mandrel and non-mandrel line cuts are separated by a center-to-center distance of 50 nm or less.

4. The method of claim 1 comprising:
   patterning the array of mandrels into the third hardmask layer prior to patterning the beta trench and gamma trench, wherein the second hardmask layer between the mandrels is exposed;
   patterning the beta trench into the mandrels to expose the third hardmask layer within the beta trench; and
   patterning the gamma trench into the second hardmask layer between the mandrels to expose the first hardmask layer within the gamma trench.

5. The method of claim 1 comprising:
   disposing a gamma lithographic stack over the structure;
   utilizing a single non-mandrel line cut mask to pattern a gamma opening into the gamma lithographic stack; and
   anisotropically etching the gamma lithographic stack to form the gamma trench into the second hardmask layer and to expose the first hardmask layer within the gamma trench.

6. The method of claim 1 comprising:
   disposing a beta lithographic stack over the structure;
   utilizing a single mandrel line cut mask to pattern a beta opening into the beta lithographic stack; and anisotropically etching the beta lithographic stack to form the beta trench into the mandrels and to expose the third hardmask layer within the beta trench.

7. The method of claim 1 wherein the mandrel and non-mandrel line cuts have an equal width, the method comprising:
   patterning the gamma trench to have a gamma trench width equal to a center-to-center distance between the non-mandrel line cuts plus the width of a non-mandrel line cut; and
   patterning the beta trench to have a beta trench width equal to a center-to-center distance between the mandrel line cuts plus the width of a mandrel line cut.

8. The method of claim 1 comprising:
   disposing a spacer layer over the beta trench and gamma trench, the spacer layer having a spacer layer thickness;
   anisotropically etching the spacer layer to form the first and second inner spacers, the inner spacers having a width equal to the thickness of the spacer layer.

9. The method of claim 1 comprising:
   the mandrel line cuts each have a width substantially equal to a width of the first inner spacers;
   the non-mandrel line cuts each have a width substantially equal to a width of the second inner spacers;
   an edge to edge distance between the cuts of the first pair of mandrel line cuts substantially equals an edge to edge distance between the first inner spacers; and
   an edge to edge distance between the cuts of the second pair of non-mandrel line cuts substantially equals an edge to edge distance between the second inner spacers.

10. A method comprising:
    providing a structure having a first hardmask layer, second hardmask layer, third hardmask layer and mandrel layer disposed respectively over a dielectric stack;
    patterning an array of mandrels into the mandrel layer;
    patterning one of a gamma trench into the mandrels and a beta trench into the second hardmask layer;
    forming self-aligned first inner spacers on sidewalls of the one of the gamma trench and the beta trench, the first inner spacers forming a portion of a pattern; and
    etching the pattern into the dielectric stack to form an array of alternating mandrel and non-mandrel metal lines extending longitudinally in a Y direction and being self-aligned in a perpendicular X direction, the portion of the pattern formed by the first inner spacers forming a first pair of line cuts in one of a mandrel line and a non-mandrel line, the cuts in the first pair of line cuts being separated by a center-to-center distance of less than 100 nm and being self-aligned in the Y direction.

11. The method of claim 10 comprising:
    patterning the other of a gamma trench into the mandrels and a beta trench into the second hardmask layer;
    forming self-aligned second inner spacers on sidewalls of one of the gamma trench and the beta trench, the second inner spacers forming a portion of the pattern; and
    etching the pattern into the dielectric stack to form the array of alternating mandrel and non-mandrel metal lines, the portion of the pattern formed by the second inner spacers forming a second pair of line cuts in the other of a mandrel line and a non-mandrel line, the cuts in the second pair of line cuts being separated by a center-to-center distance of less than 100 nm and being self-aligned in the Y direction.

12. The method of claim 11 wherein the cuts in the first and second pair of line cuts are separated by a center-to-center distance of 25 nm or less.

13. The method of claim 11 comprising:
    patterning the array of mandrels into the third hardmask layer prior to patterning the beta trench and gamma trench, wherein the second hardmask layer between the mandrels is exposed;
    patterning the beta trench into the mandrels to expose the third hardmask layer within the beta trench; and
    patterning the gamma trench into the second hardmask layer between the mandrels to expose the first hardmask layer within the gamma trench.

14. The method of claim 11 wherein the first pair of line cuts is a pair of mandrel line cuts in the mandrel line, the second pair of line cuts is a pair of non-mandrel line cuts in a non-mandrel line and all cuts have an equal width, the method comprising:
    patterning the gamma trench to have a gamma trench width substantially equal to the center-to-center distance between the pair of non-mandrel line cuts plus the width of a non-mandrel line cut; and
    patterning the beta trench to have a beta trench width substantially equal to the center to center distance between the pair of mandrel line cuts plus the width of a mandrel line.

15. The method of claim 11 comprising:
    disposing a spacer layer over the structure after patterning the beta trench and gamma trench, the spacer layer having a substantially uniform spacer layer thickness; and
    anisotropically etching the spacer layer to form:
      first spacers on sidewalls of the mandrels,
      the first inner spacers on the sidewalls of the beta trench;
      the second inner spacers on the sidewalls of the gamma trench,
      an exposed portion of the third hardmask layer within the beta trench, the exposed portion of the third hardmask layer defining an edge-to edge distance between the first inner spacers, and
      an exposed portion of the first hardmask layer within the gamma trench, the exposed portion of the first hardmask layer defining an edge-to edge distance between the second inner spacers.

16. The method of claim 15 comprising removing the mandrels to form the pattern, the pattern including the first spacers, the first inner spacers, the second inner spacers, the exposed portion of the first hardmask layer within the gamma trench, the exposed portion of the third hardmask layer within the beta trench and exposed portions of the second hardmask layer between the first spacers.

* * * * *